United States Patent [19]

Cheng et al.

[11] Patent Number: 5,155,844
[45] Date of Patent: Oct. 13, 1992

[54] BACKGROUND MEMORY TEST DURING SYSTEM START UP

[75] Inventors: Chingshun Cheng; Scott L. Porter, both of Austin; William C. Richardson; Paul J. Roy, both of Round Rock, all of Tex.

[73] Assignee: International Business Machines Corporation, Armonk, N.Y.

[21] Appl. No.: 479,911

[22] Filed: Feb. 14, 1990

[51] Int. Cl.$^5$ .................................................. G11C 29/00
[52] U.S. Cl. ........................................ 395/575; 371/21.6
[58] Field of Search .................... 371/16.1, 21.2, 21.6; 364/280.2, 280.3, 267.1

[56] References Cited

U.S. PATENT DOCUMENTS

| | | | |
|---|---|---|---|
| 3,387,276 | 6/1968 | Reichow. | |
| 3,838,260 | 9/1974 | Nelson | 371/16.1 |
| 4,527,251 | 7/1985 | Nibby, Jr. et al. | 371/11.1 |
| 4,582,990 | 4/1986 | Stevens | 250/328 |
| 4,751,656 | 6/1988 | Conti et al. | 371/10.3 |
| 4,897,870 | 1/1990 | Golden | 379/144 |
| 4,933,845 | 6/1990 | Hayes | 395/325 |
| 5,012,408 | 4/1991 | Conroy | 395/425 |

OTHER PUBLICATIONS

Peterson et al., Operating System Concepts, 2nd Edition, Addison-Wesley Publishing Company, ©1985.
IBM Technical Disclosure Bulletin, "Power on Machine Check for Multi-Processor System," P.C., Schloss, et al., vol. 25, No. 3B, Aug. 1982, pp. 1776-1777.

Primary Examiner—Robert W. Beausoliel
Assistant Examiner—Henry C. Lebowitz
Attorney, Agent, or Firm—Andrew J. Dillon

[57] ABSTRACT

A system and method is provided for testing a computer system main memory during system startup. An initial block of memory is tested and marked as valid or invalid during a startup sequence, with the remaining system memory initially marked as bad. An operating system and applications can be loaded into the initial block and operate normally, and a concurrent process is invoked to test the remaining system memory. This allows the remaining system memory to be tested and marked as valid during normal system operation.

14 Claims, 2 Drawing Sheets

BACKGROUND MEMORY TEST DURING SYSTEM START UP

BACKGROUND OF THE INVENTION

1. Field of the Invention

The present invention relates generally to digital computer systems, and more specifically to a system and method for testing memory in a computer system.

2. Description of the Prior Art

When operation of a computer system is started, it is common practice to test the main system memory by writing a preselected data pattern to every memory location and reading the memory locations back to see if they are correct. This allows the system to determine which memory locations are good and mark the bad locations so that they will not be used. A memory test is generally performed when power is first applied to the system, and sometimes after certain system resets. The process of restarting the computer system, of which such memory test is a part, is often referred to as the system boot (bootstrap), or IPL (initial program load).

As the amount of main memory used in computer systems increases, a longer period of time is required to test the system memory. Computer systems with several tens of megabytes of memory have become common only relatively recently. Future systems are expected to have one or more hundreds of megabytes. The time required for testing the main memory in such systems is becoming quite long. Since programs cannot be run using the system memory until it has been tested, a significant delay is encountered before the system can be used for productive applications.

With some computer systems, the system memory test at boot time is simply skipped, or performed only at the option of a user. In many cases, skipping the memory test causes no problem because of the high reliability of computer semiconductor memories. However, problems do occasionally occur and the risk of not performing the check can be high. As the amount of main memory used in computer systems increases, the chances of one or more bad memory locations occurring increases. This means that memory testing, in general, is more important for those computer systems for which it takes the longest amount of time.

It would therefor be desirable to provide a system and method for testing all of the main memory of a computer system. It would be further desirable for such a system and method to test system memory without requiring long delays when a computer system is booted.

SUMMARY OF THE INVENTION

It is therefor an object of the present invention to provide a system and method for testing a computer system memory which can check the entire system memory.

It is another object of the present invention to provide such a system and method which minimizes the delay caused by testing before the computer system can be used.

It is a further object of the present invention to provide such a system and method which is useable with a computer system with any amount of main system memory.

Therefor, according to the present invention, a system and method is provided for testing a computer system main memory during system startup. An initial block of memory is tested and marked as valid or invalid during a startup sequence, with the remaining system memory initially marked as bad. An operating system and applications can be loaded into the initial block and operate normally, and a concurrent process is invoked to test the remaining system memory. This allows the remaining system memory to be tested and marked as valid during normal system operation.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
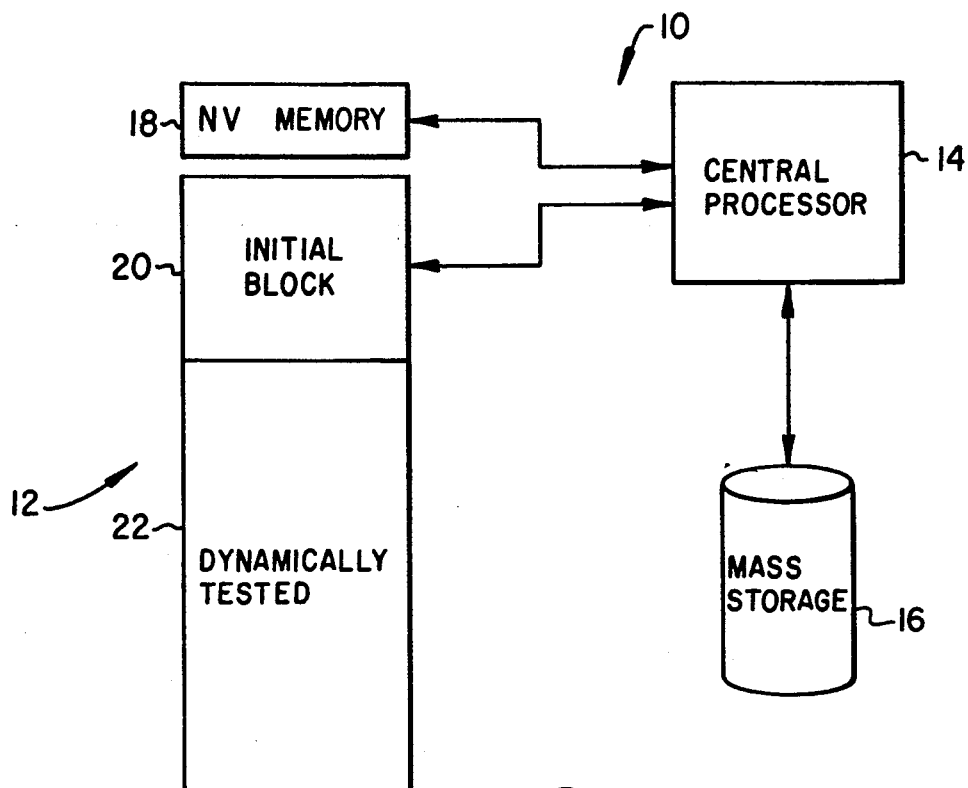
FIG. 1 is a block diagram of portions of a computer system utilizing the present invention.

Referring to FIG. 1, a computer system generally referred to by reference number 10 includes a main system memory 12 connected to a central processor 14. A mass storage device 16, typically a magnetic or optical device, is connected to the central processor 14. Various portions of the system 10 well known in the art, such as input/output devices, communications buses and memory management units, are not shown in FIG. 1 but would normally be included with the system.

Main memory 12, for purposes of the present invention, can be conceptually divided into three regions. A non-volatile memory 18 provides programs and data which must be retained by system 10 when power is not applied thereto. The remaining, volatile, memory is divided into an initially tested block 20 and a dynamically tested block 22.

Non-volatile memory 18 is known in the art, and can be, for example, an EEPROM or CMOS SRAM with an integral battery backup. It may also be stored in a known location on a media such as a magnetic disk. Volatile memory, 20, 22 is typically DRAM. Central processor 14 would generally be expected to include a memory management unit (not shown), and a memory cache connected to main system memory 12.

When the system 10 is powered up, central processor 14 bootstraps itself into operation using programs and data stored in non-volatile memory 18. It then performs a memory test only on the initially tested block 20. Once memory block 20 has been tested, the boot sequence is completed and an operating system loaded into the initial block 20 from the mass storage device 16. Normal system operation can begin at this time, with a bitmap being retained within system memory 12 which indicates those portions of memory 12 which have been tested and marked as good.

The operating system loaded into the initially tested block 20 preferably supports multiprocessing, and should at least support the performance of a background process. The operating system is also preferably a demand paged virtual memory system, so that the virtual memory space in which it runs is not affected by the amount of physical memory which is actually available. A memory testing process is initiated by the operating system, and used to test the dynamically tested memory block 22 while the operating system otherwise operates normally. This allows the dynamically tested block 22 to be tested while the remainder of the system functions in the usual manner. Using this technique, a longer elapsed real time is generally required before all of the main memory 12 has been tested. However, the delay which is experienced before normal system operation begins can be much less.

Figure 2:
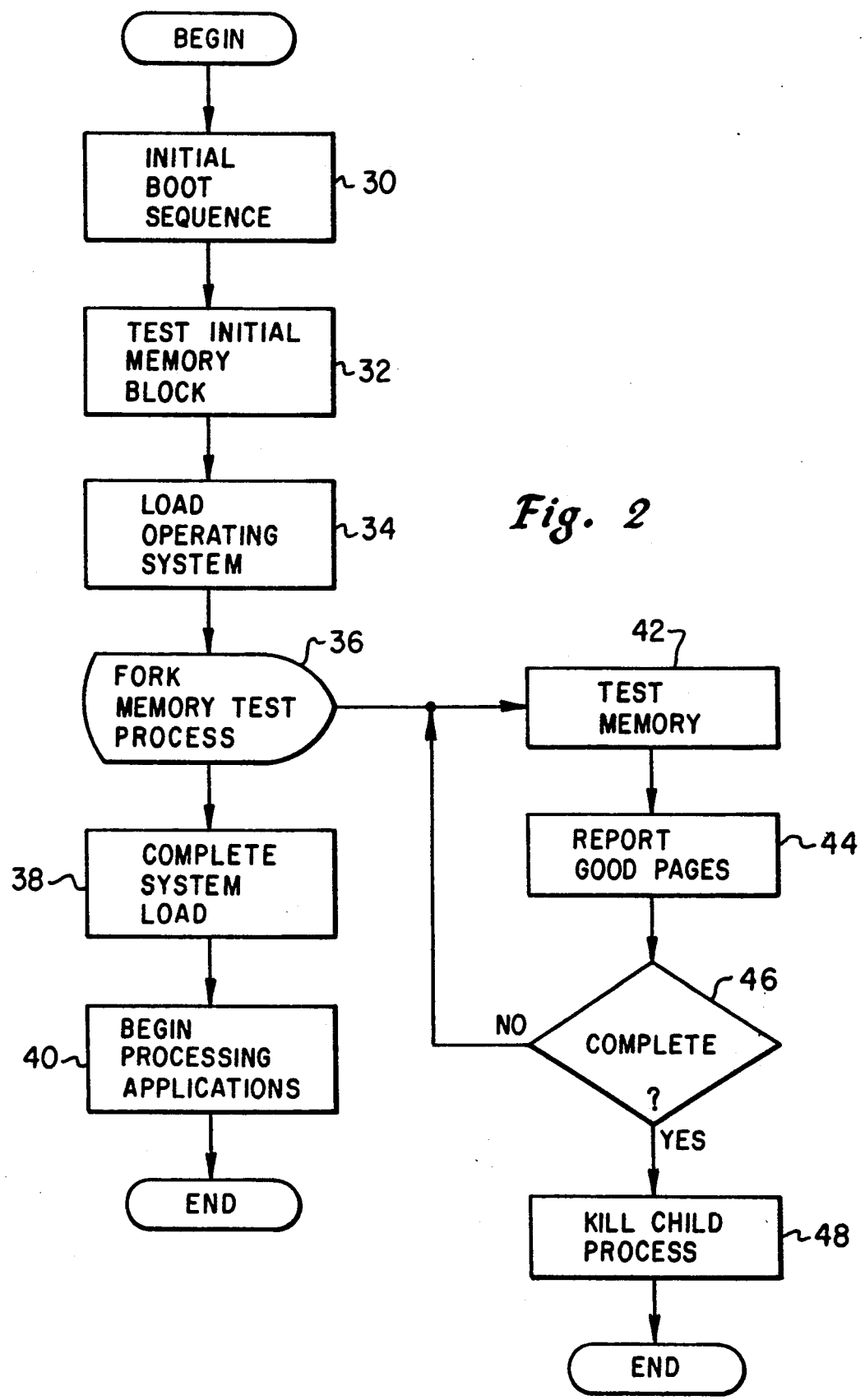
FIG. 2 is a flowchart of a method of testing system memory according to the present invention.

Referring to FIG. 2, a flowchart illustrates the preferred steps utilized by the present invention. When power is applied to the system, or a system reset occurs for which a memory test is desired, an initial boot sequence is performed 30. The boot sequence includes a test of the initial memory block 32 followed by loading the main operating system into main memory 34.

In some systems, the entire operating system will be loaded in step 34. In others, having very large and complex operating systems, it may be desirable to only load a portion of the operating system into main memory in step 34. The portion loaded in should be enough to enable support of concurrent processes. A concurrent memory test process is then initiated in step 36, and the remainder of the operating system, if any, completes loading 38. At this time, user and other applications can begin processing in the normal manner 40.

The memory test process initiated in step 36 is preferably a child process which simply tests memory locations by writing preselected data patterns to every memory location and reading them back to insure that such memory locations are functional. If desirable, more than one test pattern can be written to each location. A small portion of memory, such as one or a few physical memory pages, is tested by the child process at one time 42. Good pages are reported 44 by writing an appropriate bit or bits into a physical memory bitmap used by the virtual memory manager to identify good memory locations. If the memory testing process is not complete 46, control returns to step 42 to test additional memory. When the test of step 46 indicates that all of the dynamically tested portion of main memory 22 has been tested, the child process associated with memory testing ends 48.

Figure 3:
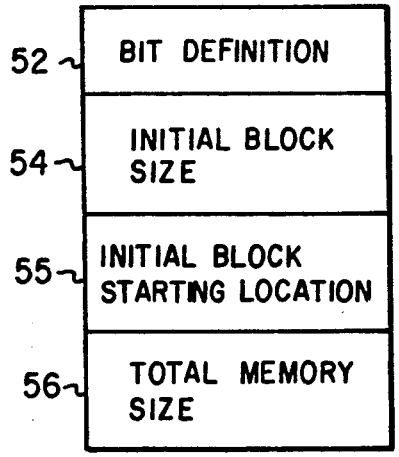
FIG. 3 is a data structure indicating information preferably stored in a nonvolatile memory utilized in the present invention.

FIG. 3 illustrates a data structure 50 indicating information which is preferably stored in the nonvolatile memory 18 for use in the present invention. A bit definition value 52 indicates the size of the memory block which corresponds to each bit entered in a physical memory bitmap accessed by the virtual memory manager. This value may be expressed in terms of bytes, words, or pages according to the design of the system 10.

An initial block size entry 54 indicates the size of the initially tested block 50, and may be expressed in terms of physical pages or other measure as desired. A starting location for the initial block 55 is provided to allow the initial block to be located anywhere in physical memory. In many systems, the starting location 55 can be omitted, with the initial block beginning at memory location 0 or some other default location. A total memory size value 56 indicates the total amount of volatile memory 20, 22 present in the system, or may be used to store a value specifically for the size of dynamically tested block 22 if desired. If the amount of physical main memory present in the system 10 is changed, the Values 54, 56 can be changed.

Figure 4:
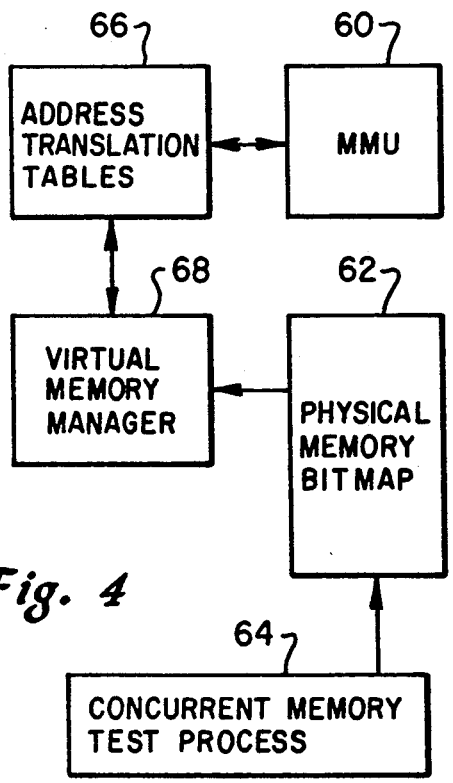
FIG. 4 is a block diagram showing use of a bitmap by a memory management unit.

FIG. 4 illustrates the relationship between a memory management unit 60, the physical memory bitmap 62, and the concurrent memory test process 64. The memory management unit 60 accesses address translation tables 66 to determine which memory pages are available for use. Address translation tables 66 are updated by a virtual memory manager 65 from information available in the bitmap 62. As bitmap 62 is updated to reflect testing of additional memory, the virtual memory manager 68 updates the address translation tables 66 for use by the memory management unit 60.

The bitmap 62 is an array of bits, with each bit corresponding to one or more physical pages as defined by the bit definition value 52. If one or more memory locations are bad, usually due to failure of a semiconductor device somewhere within the system, those invalid locations will be reflected within the bitmap 62 and will not be listed in the address translation tables 66 for storage of programs and data.

During the boot sequence, bitmap 62 is initialized to show all memory locations invalid, and good pages, or groups of pages, are marked as good therein during the initial memory test. The virtual memory manager 65 then writes the results of the initial memory test into the address translation tables 66. As far as the memory management unit 60 is concerned, there is no difference between a physical page which has been tested and found bad and one which is not yet been tested.

The concurrent memory test process 64, as it successfully tests small blocks of memory, marks them as good by setting the appropriate bit or bits within the bitmap 62. The virtual memory manager 68 periodically examines the bitmap 62, and updates the address translation tables 66. These physical memory locations are now available for use by the memory management unit 60. As execution of the concurrent memory test process 64 continues, the bitmap 62 will reflect that more and more physical memory is available for use.

The size of the memory bitmap 62 depends on the amount of main memory actually present within the system 10 The bit definition value 52 is used to determine the size of the memory block which corresponds with each single bit entry in the bitmap 62. This can be used to prevent bitmap 62 from growing too large for extremely large memories 12 by increasing the block size corresponding to each bit within bitmap 62.

A brief example will illustrate the extent of the time savings which can be encountered when using the present invention. Assume that 200 megabytes of main system memory are present, and they can normally be tested at rate of one megabyte per second. Assume further that at least six megabytes of physical memory are needed to efficiently execute the operating system, and various applications such as input/output device testers and initializers and miscellaneous system housekeeping applications require at least four megabytes for efficient operation. Instead of waiting 200 seconds for the entire physical memory to be tested initially, an initial 10 megabyte block can be tested in 10 seconds followed by loading of the operating system. Within the initial 10 megabyte block, applications can be run to initialize and test various input/output devices connected to the system, including testing communications with other systems which may be connected to this one. One of the processes which begins operation is a special system process which is allowed to perform memory testing on the remaining main memory which was initially marked as bad. As time goes on, more and more physical memory is available to the system, which will tend to speed up system operation as the amount of virtual memory paging which is required decreases. Although the real time which passes before the entire system memory is tested could be much longer than the 200 seconds used if it is tested at boot time, worthwhile system operations are commenced after a delay only 5% as long.

Although the preferred embodiment has been described as applying to dynamic RAM, it has applicability elsewhere. It can be used to test SRAM, or to test for the occurrence of non-volatile RAM in selected parts of the physical address map. Non-volatile memory can be tested both to see whether it exists, and whether it is correct using a CRC or other known checking technique.

While the invention has been particularly shown and described with reference to a preferred embodiment, it will be understood by those skilled in the art that various changes in form and detail may be made therein without departing from the spirit and scope of the invention.

I claim:

1. A method for testing a computer system memory, comprising the steps of:
   initializing a data structure indicating unavailability of memory blocks in the computer system memory for storage of data;
   testing a first portion of the computer system memory;
   marking in the data structure as available the memory blocks of said first portion tested as good;
   after the memory blocks of said first portion tested as good have been marked as available, loading a paged virtual memory multitasking operating system, having a virtual memory manager, into the memory blocks of said first portion tested as good and beginning execution thereof;
   after the paged virtual memory multitasking operating system begins execution, testing remaining untested memory blocks in the computer system memory concurrently with normal operations of the paged virtual memory multitasking operating system;
   as memory blocks are tested, marking memory blocks that test as good available for storage of data; and
   utilizing the data structure to enable the paged virtual memory multitasking system operating system to use only the memory blocks marked as available.

2. The method of claim 1, wherein the data structure used to indicate availability of memory blocks is a bitmap which upon initialization indicates that all memory blocks are bad and wherein marking comprises:
   setting a bit for each memory block tested as good.

3. The method of claim 2, wherein each bit in the bitmap corresponds to a block of memory having a predetermined size.

4. The method of claim 3, wherein the predetermined memory block size is stored in a non-volatile memory.

5. The method of claim 1, further comprising the step of:
   prior to testing of the first portion, reading a size for the first portion from a non-volatile memory.

6. The method of Claim 5, further comprising the step of:
   during said reading step, also reading a location for the first portion from the non-volatile memory.

7. The method of claim 5, further comprising the step of:
   during testing of the remaining computer system memory, reading a size for the remaining computer system memory from the non-volatile memory.

8. The method of claim 1, wherein said data structure is a bitmap, with each bit corresponding to a block of memory.

9. A system for testing memory within a digital computer comprising:
   a central processor;
   a main system memory connected to said central processor;
   a paged virtual memory multitasking operative system suitable for executing within tested portions of said main system memory;
   means for initializing a data structure indicating unavailability for storage of data of the main system memory;
   means for testing a first portion of said main system memory and for marking in the data structure said first portion thereof as available for storage of data prior to loading said paged virtual memory multitasking operating system into said first portion;
   means for testing a second portion of the main system memory during execution of said paged virtual memory multitasking operating system and progressively marking blocks in the data structure constituting said second portion of the main system memory as available for storage of data; and
   virtual memory manager means for accessing the data structure to determine available memory blocks.

10. The system of claim 9, further comprising:
   a non-volatile memory containing information indicative of the sizes of the first portion and the second portion.

11. The system of claim 9, further comprising:
   a memory management unit connected to said central processor and to said main system memory for allocating physical memory locations for use by the system; and
   a second data structure connected to the memory management unit and the virtual memory manager means, wherein the second data structure is used by the virtual memory manager to indicate available memory, and the memory management unit to allocate physical memory.

12. The system of claim 11, wherein the second data structure comprises an address translation table.

13. The system of claim 9, wherein the data structure comprises a bitmap.

14. The system of claim 13, further comprising:
   a non-volatile memory containing an indicator of a memory block size which corresponds to each bit of said bitmap.

* * * * *

UNITED STATES PATENT AND TRADEMARK OFFICE
CERTIFICATE OF CORRECTION

PATENT NO. : 5,155,844

DATED : October 13, 1992

INVENTOR(S) : Chingshun Cheng, et al.

It is certified that error appears in the above-identified patent and that said Letters Patent is hereby corrected as shown below:

Col 3, line 59, "50" to —20—.
Col. 4, line 10, "65" to --68--.
Col. 4, line 26, "65" to --68--.

Signed and Sealed this

Twenty-third Day of November, 1993

Attest:

BRUCE LEHMAN

Attesting Officer     Commissioner of Patents and Trademarks